(12) United States Patent  
Nakajima et al.

(10) Patent No.: US 8,029,684 B2  
(45) Date of Patent: Oct. 4, 2011

(54) SELF-EMISSION PANEL AND METHOD OF MANUFACTURING THE SAME

(75) Inventors: Shinji Nakajima, Yamagata (JP); Yusuke Nakajima, Yamagata (JP); Toshinao Yuki, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 402 days.

(21) Appl. No.: 12/392,764

(22) Filed: Feb. 25, 2009

(65) Prior Publication Data

US 2009/0163108 A1  Jun. 25, 2009

Related U.S. Application Data

(62) Division of application No. 11/485,471, filed on Jul. 13, 2006, now Pat. No. 7,535,164.

(30) Foreign Application Priority Data

Jul. 19, 2005 (JP) .................................. 2005-208822

(51) Int. Cl.  
*B29D 11/00* (2006.01)  
(52) U.S. Cl. ......................................... 216/24; 315/504  
(58) Field of Classification Search .................... None  
See application file for complete search history.

(56) References Cited

U.S. PATENT DOCUMENTS

| 6,046,547 | A | 4/2000 | Nishio et al. |
| 6,825,061 | B2 | 11/2004 | Hokari et al. |
| 2003/0080338 | A1 | 5/2003 | Yamazaki et al. |
| 2004/0217704 | A1 | 11/2004 | Iwase et al. |
| 2004/0232814 | A1* | 11/2004 | Sakai .............................. 313/310 |
| 2004/0256979 | A1* | 12/2004 | Murakami et al. ............ 313/503 |
| 2004/0263056 | A1* | 12/2004 | Seo et al. ....................... 313/500 |

FOREIGN PATENT DOCUMENTS

JP  09-245965 A  9/1997

* cited by examiner

*Primary Examiner* — Binh Tran  
*Assistant Examiner* — David A Cathey, Jr.  
(74) *Attorney, Agent, or Firm* — Arent Fox, LLP

(57) ABSTRACT

A self-emission panel and a method of manufacturing a self-emission panel which can prevent emission failures from occurring due to various factors, thereby achieving a self-emission panel that is free from emission failures. The self-emission panel is manufactured by forming a first conductive layer on a substrate directly or via other layers, forming a deposition layer including a luminescent layer on the first conductive layer, and forming a second conductive layer on the deposition layer. This manufacturing method includes: a first step of forming a sectioning layer for sectioning an opening for making a emission area on the first conductive layer after the formation of the first conductive layer; a second step of applying surface treatment to at least the surface of the first conductive layer inside the opening; and a third step of depositing a deposition layer on the first conductive layer given surface treatment in the second step.

4 Claims, 10 Drawing Sheets

PRIOR ART

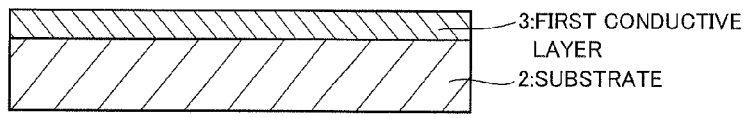
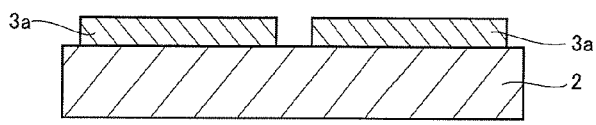
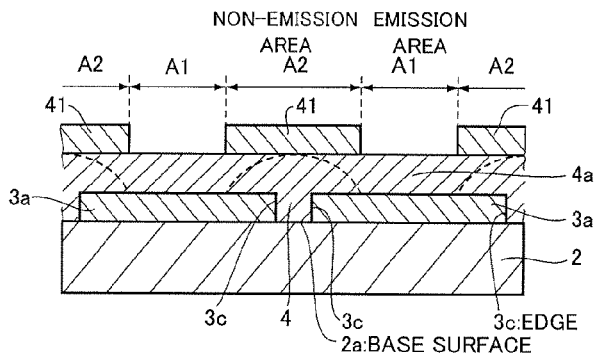
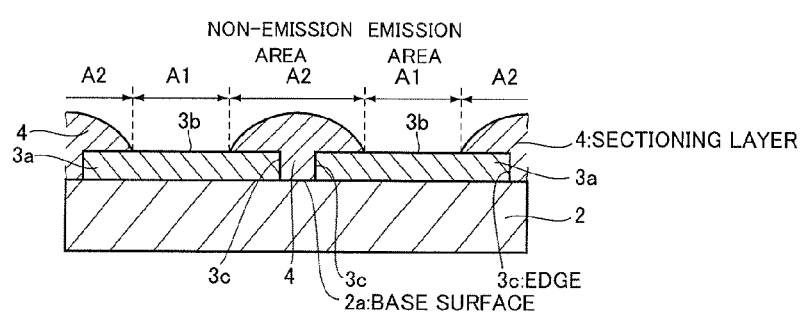
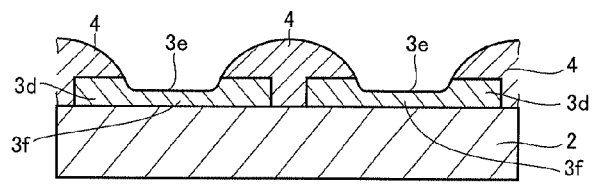
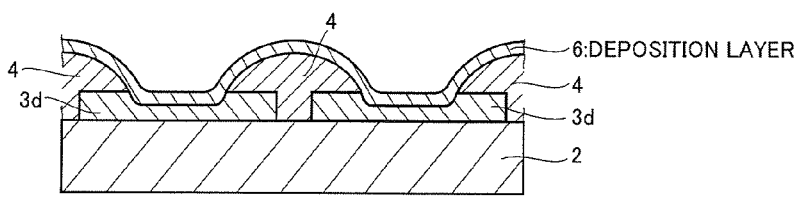
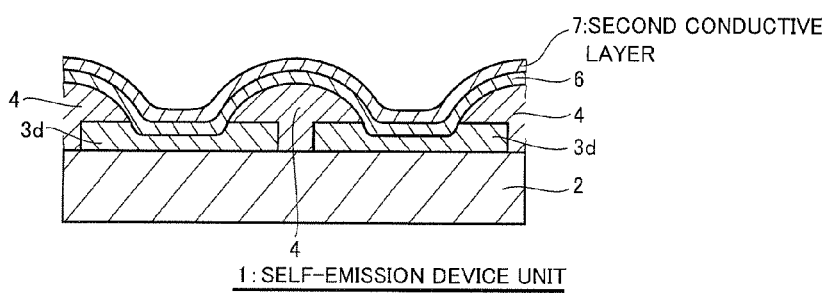

SELF-EMISSION PANEL AND METHOD OF MANUFACTURING THE SAME

CROSS-REFERENCE TO RELATED APPLICATION

This application is a divisional of application Ser. No. 11/485,471, filed Jul. 13, 2006, now issed U.S. Pat. No. 7,535,164 B2, the entire specification, claims and drawings of which are incorporated herewith by reference.

BACKGROUND OF THE INVENTION

The present invention relates to a self-emission panel, and a method of manufacturing the same.

The present application claims priority from Japanese Patent Application No. 2005-208822, the disclosure of which is incorporated herein by reference.

Self-emission panels, typified by organic electroluminescence (EL) panels, are now under intensive research and development in expectation of various applications. The possible applications include the display units of cellular phones, low-profile television sets, information terminals, and the like, as well as car-mounted function displays including such instrument panels as a speed indicator, function display units of electric appliances, film-like display units, outdoor signboards, and lightings.

These self-emission panels are each formed by arranging one or a plurality of self-emission devices on a substrate. Among examples of the self-emission devices are such light-emitting devices as an LED (Light-Emitting Diode) and an FED (Field Emission Display), aside from organic EL devices.

These self-emission devices have the structure that a first conductive layer is formed on a substrate directly or via other layers, a deposition layer including a luminescent layer is laminated on the first conductive layer, and a second conductive layer is formed on the deposition layer. When a voltage is applied to between the first conductive layer and the second conductive layer, electrons are injected from a cathode-side, or either one of the first and second conductive layers, and holes are injected from an anode-side, or the other of the first and second conductive layers. Then, in the luminescent layer or the like, the electrons and holes are recombined for light emission.

With such self-emission devices, the surface flatness of the first conductive layer has a significant impact on the performance of the devices and by extension the self-emission panels since at least the deposition layer including the luminescent layer is formed on the first conductive layer. Japanese Patent Application Laid-Open Publication No. Hei 9-245965 has proposed an organic EL device which comprises an anode, at least one organic layer including an organic luminescent layer, and a cathode. In this organic EL device, at least the surface of the anode in contact with the organic layer is polished so that it has a surface roughness of 50 angstroms or less in maximum height (Rmax: JIS B0601).

As discussed in the foregoing publication, self-emission panels can cause performance deteriorations including an emission failure. Among possible causes is the occurrence of a short circuit between the first conductive layer and the second conductive layer. Possible causes of this short circuit, in turn, include foreign substances such as dust adhering to the surface of the first conductive layer (for example, anode) that is formed on the substrate. To avoid this, as in the foregoing publication, surface polishing is performed to flatten the surface after the formation of the first conductive layer (anode). Nevertheless, even after the polishing of the first conductive layer (anode), dust and other foreign substances can adhere to the top of the first conductive layer (anode) in the process of making openings in an insulating film or the like, going through a deposition preprocessing step such as UV, ozone, or plasma irradiation and heating, and finally performing the step of depositing the deposition layer. An example will be given below.

As shown in FIG. 1A, a first conductive layer $3j$ (anode) is formed on a substrate $2j$, and a sectioning layer $4j$ for sectioning emission areas A1 is formed thereon. This sectioning layer $4j$ sections openings S for a deposition layer to be laminated in. When patterning this sectioning layer $4j$, foreign substances such as dust particles 21 and 22, and resists, oxidized films, and other coatings 23 can adhere to the exposed surfaces of the first conductive layer $3j$. As shown in FIG. 1B, structures such as barrier portions $5j$ are sometimes formed on the sectioning layer $4j$. Since it is impossible to perform the foregoing polishing after the formation of the sectioning layer $4j$, the barrier portions $5j$, and other structures, there has been the problem that foreign substances described above cannot be removed to avoid emission failures.

SUMMARY OF THE INVENTION

One of the objects of the present invention is to address the foregoing problems. That is, objects of the present invention include the following: to apply surface treatment to the first conductive layer effectively, thereby preventing emission failures from occurring due to various factors; to perform a deposition step after the surface treatment of the first conductive layer without the intervention of any other steps, thereby avoiding deposition failures effectively; and to apply surface treatment to the first conductive layer effectively after the formation of such structures as the sectioning layer on the first conductive layer, thereby obtaining a self-emission panel that is free from emission failures.

To achieve the foregoing objects, the present invention provides at least the configurations according to the following respective aspects.

A method of manufacturing a self-emission panel according to a first aspect of the invention is one including forming a first conductive layer on a substrate directly or via another layer, laminating a deposition layer including a luminescent layer on the first conductive layer, and forming a self-emission device in an opening for making an emission area, the self-emission device constituting a second conductive layer on the deposition layer, the method comprising: a first step of forming a sectioning layer for sectioning the opening for making an emission area on the first conductive layer after the formation of the first conductive layer; a second step of applying surface treatment to at least a surface of the first conductive layer inside the opening after the first step; and a third step of depositing the deposition layer at least on the first conductive layer that is given the surface treatment.

A self-emission panel according to a second aspect of the present invention comprises a self-emission device including a first conductive layer formed on a substrate directly or via another layer, a deposition layer laminated on the first conductive layer, and a second conductive layer formed on the deposition layer, the deposition layer including a luminescent layer, the self-emission device being formed in an opening for making an emission area, the self-emission panel having a sectioning layer for sectioning the opening for making the emission area on the first conductive layer, the first conductive layer having a thin portion in the opening, a surface of the thin portion making a contact surface with the deposition layer.

BRIEF DESCRIPTION OF THE DRAWINGS

These and other objects and advantages of the present invention will become clear from the following description with reference to the accompanying drawings, wherein:

FIGS. 2A to 2G are diagrams for explaining a self-emission device unit of the self-emission panel according to a first embodiment of the present invention, having one or a plurality of self-emission devices, and a method of manufacturing the same;

DETAILED DESCRIPTION OF THE PREFERRED EMBODIMENTS

The method of manufacturing a self-emission panel according to an embodiment of the present invention is one for forming a first conductive layer on a substrate directly or via another layer, laminating a deposition layer including a luminescent layer on the first conductive layer, and forming a second conductive layer on the deposition layer. This method comprises: a first step of forming a sectioning layer for sectioning the opening for making an emission area on the first conductive layer after the formation of the first conductive layer; a second step of applying surface treatment to at least a surface of the first conductive layer inside the opening after the first step; and a third step of forming a deposition layer at least on the first conductive layer that is given the surface treatment in the second step.

A self-emission panel manufactured by the foregoing manufacturing method comprises: a first conductive layer formed on a substrate directly or via another layer; a deposition layer laminated on the first conductive layer, including a luminescent layer; a second conductive layer formed on the deposition layer; and a sectioning layer for sectioning an opening for making an emission area on the first conductive layer. The first conductive layer has a thin portion, and the surface of the thin portion makes a contact surface with the deposition layer.

According to the foregoing manufacturing method, the surface treatment is applied to at least the surface of the first conductive layer inside the opening after the formation of the sectioning layer and before the formation of the deposition layer. This makes it possible to prevent emission failures from occurring due to various factors. Since the step of forming the deposition layer is performed after the surface treatment on the first conductive layer, deposition failures can be avoided effectively. Moreover, since such structures as the sectioning layer are formed on the first conductive layer before the surface treatment is applied to the first conductive layer effectively, it is possible to obtain a self-emission panel that is free from emission failures.

Hereinafter, embodiments of the present invention will be described with reference to the drawings.

First Embodiment

FIGS. 2A to 5 are diagrams for explaining a self-emission panel and a method of manufacturing the same according to a first embodiment of the present invention.

Figure 1A:
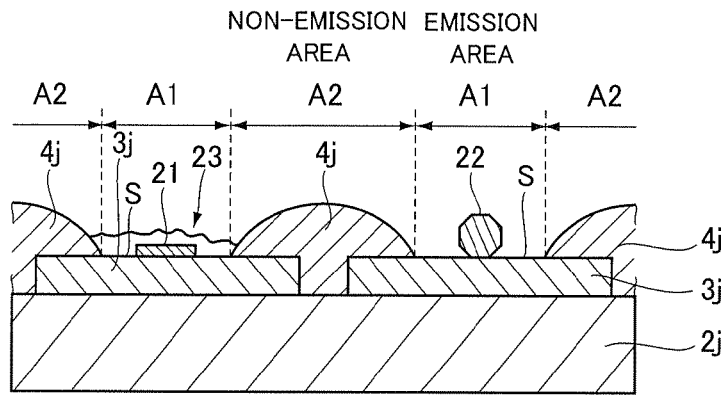
FIGS. 1A and 1B are diagrams for explaining problems of typical self-emission panels, FIG. 1A being a sectional view of a typical active drive type self-emission panel, FIG. 1B being a sectional view of a typical passive drive type self-emission panel.
Figure 1B:
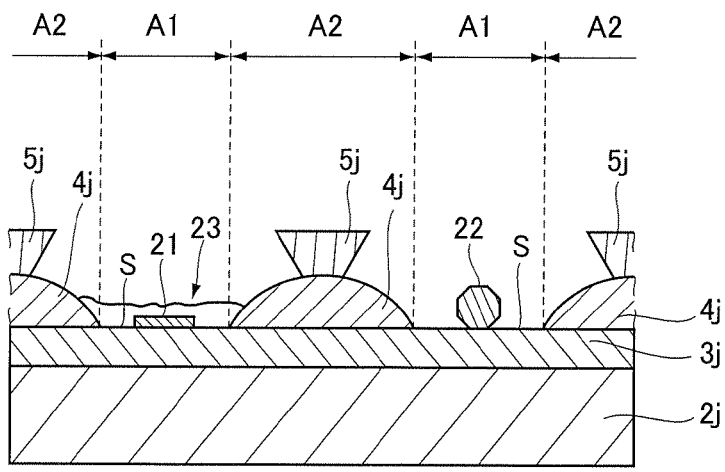
Figure 3:
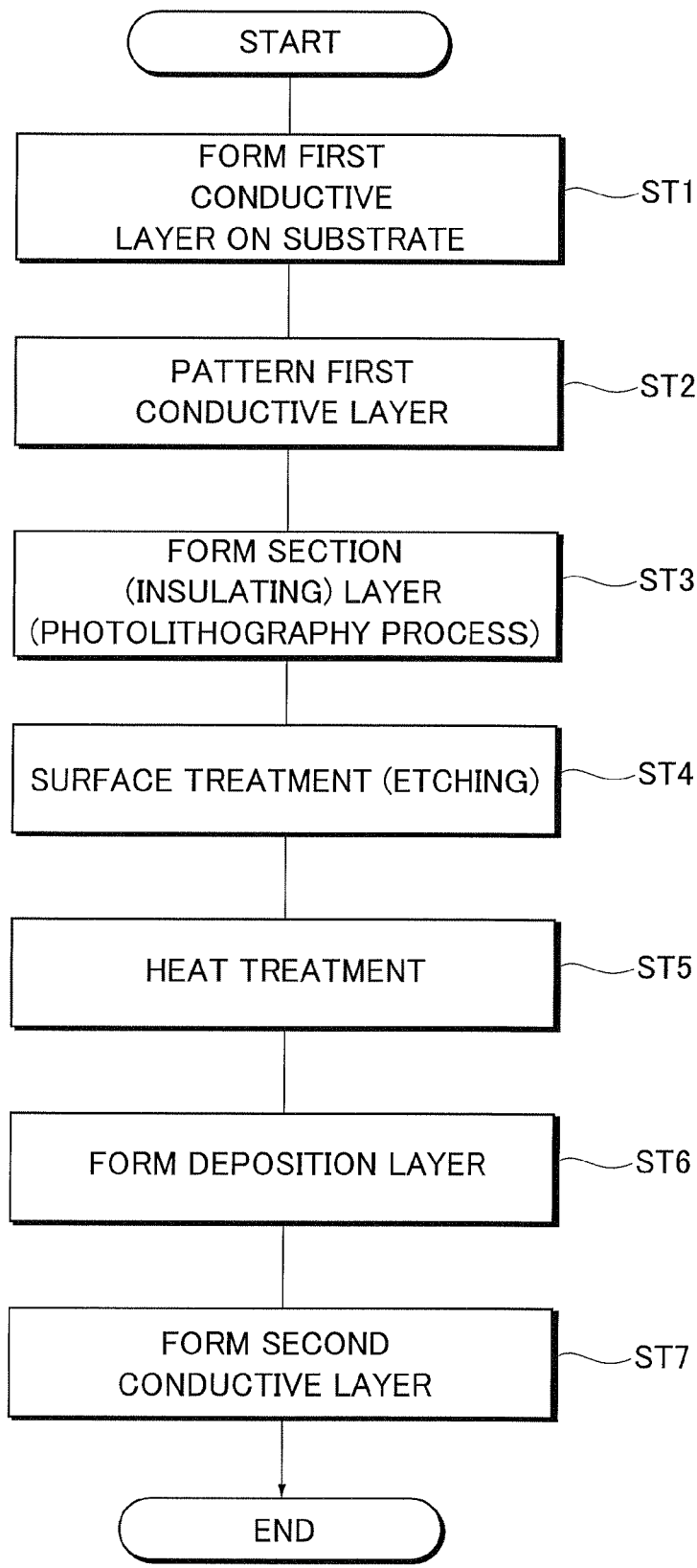
FIG. 3 is a flowchart for explaining the method of manufacturing the self-emission device unit of the self-emission panel according to the first embodiment of the present invention.

FIGS. 2A to 2G are diagrams for explaining a self-emission device unit in the self-emission panel according to the first embodiment of the present invention, having one or a plurality of self-emission devices, and a method of manufacturing the same. FIG. 3 is a flowchart for explaining the method of manufacturing the self-emission device unit in the self-emission panel according to the first embodiment of the present invention. Now, the self-emission device unit of the self-emission panel and the method of manufacturing the same according to the present embodiment will be described with reference to FIGS. 2A to 3. The following description will deal with an active drive type organic EL panel, for example.

At step ST1, a first conductive layer 3 is formed on a substrate 2 as shown in FIG. 2A. The substrate 2 has the function of a support substrate for supporting organic EL devices, for example. The substrate 2 is made of such material as glass, plastic, quartz, and metal. The first conductive layer 3 is made of a conductive material. Available materials include transparent conductive materials such as ITO (Indium Tin Oxide) and IZO (Indium Zinc Oxide), metal materials such as chromium and aluminum, and alloy materials such as a magnesium-silver alloy and an aluminum-lithium alloy. For example, when the first conductive layer 3 is made of ITO, it is deposited by sputtering or the like.

At step ST2, the first conductive layer 3 formed on the substrate 2 is patterned as shown in FIG. 2B. More specifically, a first conductive layer 3a having a predetermined pattern is formed on the substrate 2 by a photolithography process, for example.

At step ST3, a sectioning layer 4 is formed. To be more specific, an insulating film 4a is formed on the first conductive layer 3a and its base surface 2a as shown in FIG. 2C, for example. The insulating film 4a formed on the first conductive layer 3a and the base surface 2a is patterned by a photolithography process, for example, using a photo mask 41 which has openings in areas corresponding to emission areas A1, for example. This forms a sectioning layer 4 which sections openings 3b for making the emission areas A1 on the first conductive layer 3a as shown in FIG. 2D. As shown in FIG. 2D, the sectioning layer 4 is formed so as to cover edges 3c of the first conductive layer 3a and the base surface 2a. This sectioning layer 4 has the function of avoiding a short circuit between the individual traces of the first conductive layer 3 and between the first conductive layer 3 and a second conductive layer 7, for example. The sectioning layer 4 is made of a polymer insulating material typified by photosensitive resins such as polyimide. In the present embodiment, the insulating layer (sectioning layer) is formed in the areas corresponding to the non-emission areas A2 as shown in FIG. 2D.

At step ST4, foreign substances such as dust particles 21 and 22 adhering to the first conductive layer 3 and the sectioning layer 4 formed on the substrate 2 are removed. Specifically, as shown in FIG. 2E, surface treatment is applied to at least the surface of the first conductive layer 3 inside the openings 3b. This surface treatment is exercised by such means as chemical surface treatment (wet etching) for processing the first conductive layer 3a selectively with respect to the sectioning layer 4, and physical surface treatment (dry etching) for processing the first conductive layer 3 selectively with respect to the sectioning layer 4. For example, the chemical surface treatment according to the present embodiment is effected by etching, in which the first conductive layer 3a is dissolved selectively with respect to the sectioning layer 4. During the surface treatment of the present embodiment, the sectioning layer 4 functions as a mask so that the surface of the first conductive layer 3a is subjected to the surface treatment selectively with respect to the sectioning layer 4.

Figure 4:
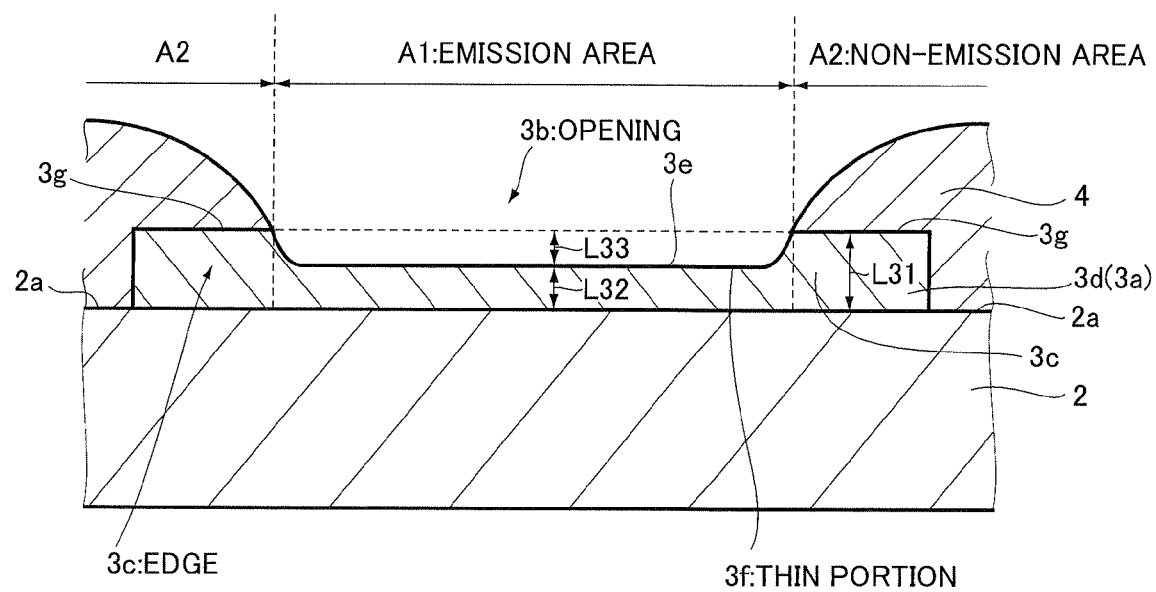
FIG. 4 is a diagram for explaining the surface treatment according to the present embodiment, showing an enlarged section of the self-emission device unit.

FIG. 4 is a diagram for explaining the surface treatment according to the present embodiment, showing an enlarged section of an organic EL device on the self-emission device unit 1. The surface treatment according to the present embodiment forms the surface of the first conductive layer 3d inside the opening 3b into a thin portion 3f as shown in FIG. 2E and FIG. 4, for example. The surface 3e of this thin portion 3f makes a contact surface with a deposition layer 6. This first conductive layer 3d has a difference in level between the surface 3e inside the opening 3b and the surface 3g covered with the sectioning layer 4. In other words, the thin portion 3f has a thickness L32 smaller than the thickness L31 of the edges 3c of the first conductive layer 3d.

For the foregoing chemical surface treatment, the first conductive layer 3a is etched by using a solvent for dissolving the first conductive layer 3, for example. Depending on the material of the first conductive layer 3, the etching may be performed by using organic solvents such as the etching solvent and resist remover solvent used in the foregoing patterning, and aqueous solutions of sodium hydroxide, hydrochloric acid, hydrofluoric acid, hydrobromic acid, sulfuric acid, nitric acid, perchloric acid, boric acid, and ferric chloride.

For physical surface treatment, known methods such as dry etching and reverse sputtering may be used. Chemical surface treatment and physical surface treatment may be performed in combination when needed.

Specifically, the surface treatment on the surface 3e of the thin portion 3f is performed at a low etching rate which is achieved by a dilute etching solution, for example. The thickness setting L32 is determined appropriately depending on such factors as the degree of how the top of the first conductive layer is stained with foreign substances. The low etching rate employed here can be achieved by various techniques. The possible techniques include: (1) using a dilute etchant; (2) decreasing the duration of the etching step; (3) reducing the amount of the etchant to be issued in the system that performs the etching step; (4) lowering the operating temperature in the etching step; and (5) using the techniques (1) to (4) in combination.

After the etching, the solvent is washed off the substrate by using pure water, for example. As a result of the surface treatment according to the present embodiment, the surface 3e of the first conductive layer 3d inside the opening 3b and the surface 3g of the same covered with the sectioning layer 4 have a level difference of approximately 50 angstroms, for example.

As compared to typical cleaning processes such as UV treatment, ozone treatment, and heat treatment, the foregoing surface treatment according to the present embodiment can remove foreign substances such as the dust particles 21 and 22 and the coating 23 from the top of the first conductive layer more effectively even in the presence of such structures as the sectioning layer 24.

At step ST5, it is preferable to apply heat treatment for drying the treatment solutions after the foregoing surface treatment. For the heat treatment, the substrate 2 provided with the first conductive layer 3d and the sectioning layer 4 shown in FIG. 2E and FIG. 4 is stored in a clean oven having chamber temperatures of approximately 300° C. over a predetermined period of time. This removes the moisture, treatment solutions, and the like from the top of the substrate 2. Additional cleaning processing may be applied by UV treatment or the like.

At step ST6, a deposition layer 6 including a luminescent layer is formed on the first conductive layer 3a that is given the foregoing etching as shown in FIG. 2F, for example. For example, the deposition layer 6 includes a luminescent layer made of organic EL device and, if needed, a hole injection layer (electron injection layer) and a hole transporting layer (electron transporting layer) for the sake of improved junction between layers and improved hole (electron) transportability. This deposition layer 6 is formed by such a deposition method as vacuum deposition, spin coating, inkjet deposition, screen printing, ionized deposition, MBE (Molecular Beam Epitaxy), electron beam deposition, sputtering, and CVD (Chemical Vapor Deposition). As described above, the deposition layer 6 is formed on the first conductive layer 3d after the etching. This improves the adhesion between the first conductive layer 3d and the deposition layer 6, improves the flatness of the interface, and makes it possible to form a favorable deposition layer 6. As a result, deposition failures can be avoided effectively.

At step ST7, a second conductive layer 7 is formed on the deposition layer 6 as shown in FIG. 2G, for example. The second conductive layer 7 is made of a conductive material, for example. If needed, a buffer layer made of an alkali metal, an alkaline earth metal, a rear earth, or an alloy of these may be interposed between the deposition layer and the second conductive layer.

Figure 5:
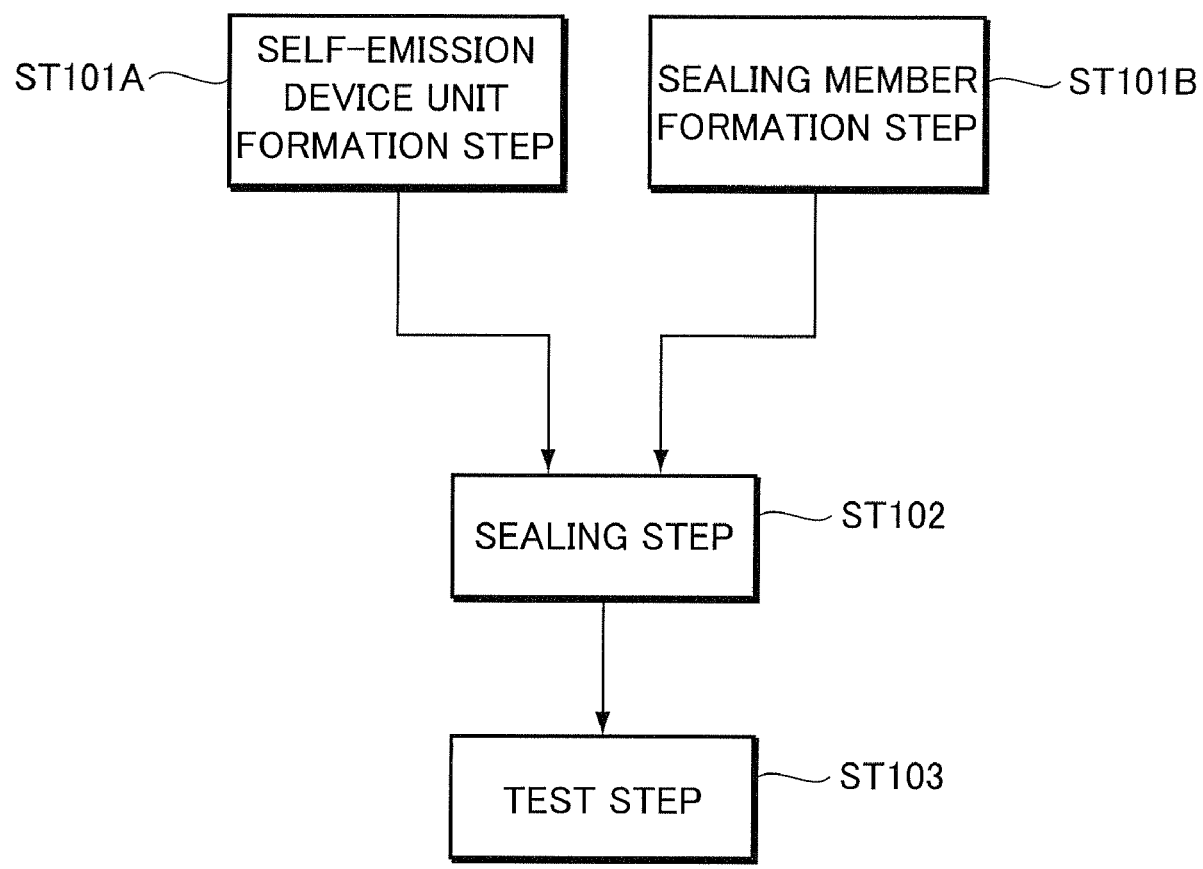
FIG. 5 is a flowchart for explaining the method of manufacturing a self-emission panel according to a second embodiment of the present invention.

FIG. 5 is a flowchart for explaining a sealing step in the method of manufacturing a self-emission panel. With reference to FIG. 5, the step of sealing the self-emission panel will be described. Initially, at a self-emission device unit formation step ST101A, the first conductive layer 3, the sectioning layer 4, the deposition layer 6, and the second conductive layer 7 are formed on the substrate 2 by using the manufacturing method of the embodiment as shown in FIGS. 2A to 2G, for example. The self-emission device unit 1 may be one in which organic EL devices are arranged in a dot matrix configuration as described above. Otherwise, one or a plurality of organic EL devices having desired patterns may be arranged. Meanwhile, at a sealing member formation step ST101B, a sealing member having a recess is formed (not shown). Next, in the sealing member formation step ST101B, a sheet-like drying member is formed in a desired pattern on the inner surface of the recess by cutting, for example.

Next, at a sealing step ST102, an adhesive is applied to around the self-emission device unit or bonding surfaces of support portions of the sealing member. The sealing member is pasted onto the substrate 2, thereby sealing the deposition layer 6 and the like. More specifically, the substrate 2 and the sealing member formed in the sealing member formation step ST101B are bonded to each other via the support portions so that the deposition layer 6 formed on the substrate 2 is enclosed. This sealing is achieved in a nitrogen, argon, or other inactive gas environment, or in a vacuum environment. Subsequently, an appropriate test step ST103 is performed if needed, and the self-emission panel is fabricated.

As has been described, the self-emission device unit 1 is manufactured by forming the first conductive layer 3 on the substrate 2 directly or via other layers, laminating the deposition layer 6 including the luminescent layer on the first conductive layer 3, and forming the second conductive layer 7 on the deposition layer 6. This manufacturing process includes: the first step of forming the sectioning layer 4 for sectioning the openings 3b for making the emission areas A1 on the first conductive layer 3a after the formation of the first conductive layer 3a; the second step of applying surface treatment to at least the surface of the first conductive layer inside the openings after the first step; and the third step of depositing the deposition layer 6 at least on the first conductive layer 3d that is given the surface treatment in the second step. This makes it possible to perform the surface treatment on the first conductive layer effectively, thereby preventing emission failures from occurring because of a short circuit and the like between the first and second conductive layers due to various factors.

Moreover, since such structures as the sectioning layer 4 are formed on the first conductive layer 3 before the surface treatment is applied to the first conductive layer 3 effectively, it is possible to obtain a self-emission panel that is free from emission failures.

In the present embodiment, the surface treatment is exercised chemically by etching in which the sectioning layer 4 is used as a mask so that the first conductive layer 3 is dissolved selectively with respect to the sectioning layer 4, for example. This makes it possible to apply the surface treatment to the surface of the first conductive layer 3 inside the openings 3b effectively.

If, for example, foreign substances on the first conductive layer 3 are removed by polishing the surface of the substrate before the formation of the deposition layer, then the structures such as the sectioning layer 4 might be damaged to cause emission failures. In contrast, the manufacturing method according to the present invention includes the chemical surface treatment or physical surface treatment such that the first conductive layer 3 is processed selectively with respect to the sectioning layer 4 as described above. This surface treatment makes it possible to remove foreign substances such as dust particles and coatings from inside the openings 3b of the first conductive layer effectively without damaging the sectioning layer 4. Besides, after the surface treatment, the heat treatment for drying the processing solution can be applied to form the deposition layer 6 favorably.

Since the present embodiment includes the step ST4 of surface treatment, it is possible to omit surface treatment to the first conductive layer 3, for example, before the sectioning layer formation step (corresponding to the first step). This can simply the manufacturing process and reduce the manufacturing time.

In the manufacturing method according to the present embodiment, the sectioning layer 4 is formed by pattering an insulating layer that is formed on the first conductive layer 3 and the base surface 2a by using a photolithography process. Even if foreign substances such as dust particles and coatings are adhering to the top of this first conductive layer 3, the foregoing surface treatment can be performed to remove the dust particles, coatings, and other foreign substances from the top of the first conductive layer 3 effectively. Besides, since the sectioning layer 4 is formed so as to cover the edges 3c of the first conductive layer 3 excluding the openings 3b, it is possible to prevent the edges 3c from the surface treatment.

Second Embodiment

Figure 6A:
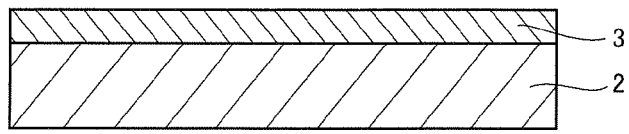
FIGS. 6A to 6F are diagrams for explaining the method of manufacturing a self-emission device unit according to the second embodiment of the present invention.
Figure 6B:
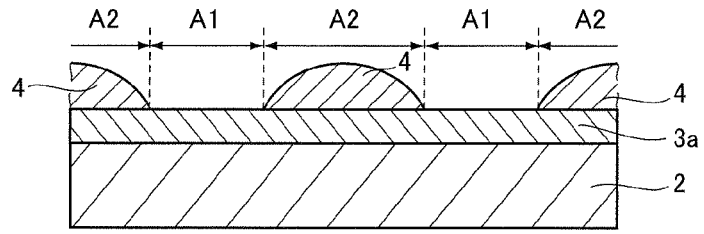

FIGS. 6A to 6F are diagrams for explaining the method of manufacturing a self-emission panel according to a second embodiment of the present invention. FIG. 7 is a flowchart for explaining the method of manufacturing a self-emission panel according to the second embodiment of the present invention. With reference to FIGS. 6A to 7, description will now be given of the method of manufacturing a passive drive type self-emission panel which uses self-emission devices according to the present embodiment. Description common to the first embodiment will be omitted in part. As shown in FIG. 7, steps ST1 to ST3 are generally the same as steps ST1 to ST3 shown in FIG. 2. Description thereof will thus be omitted.

Figure 6C:
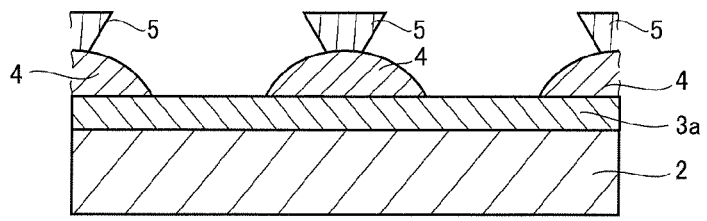
Figure 6D:
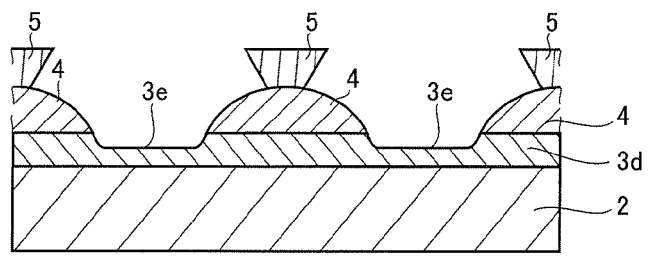
Figure 6E:
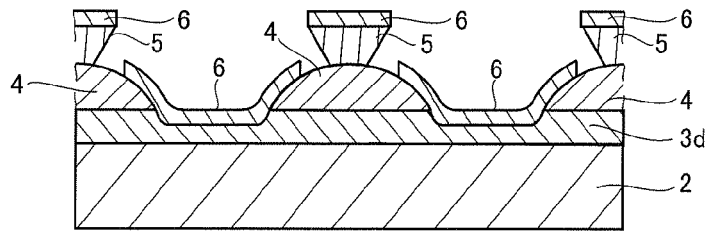
Figure 6F:
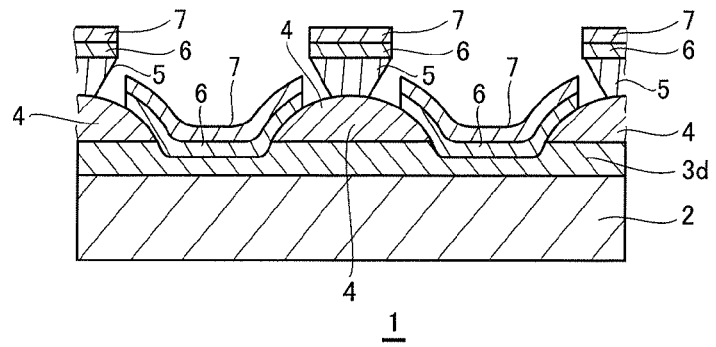
Figure 7:
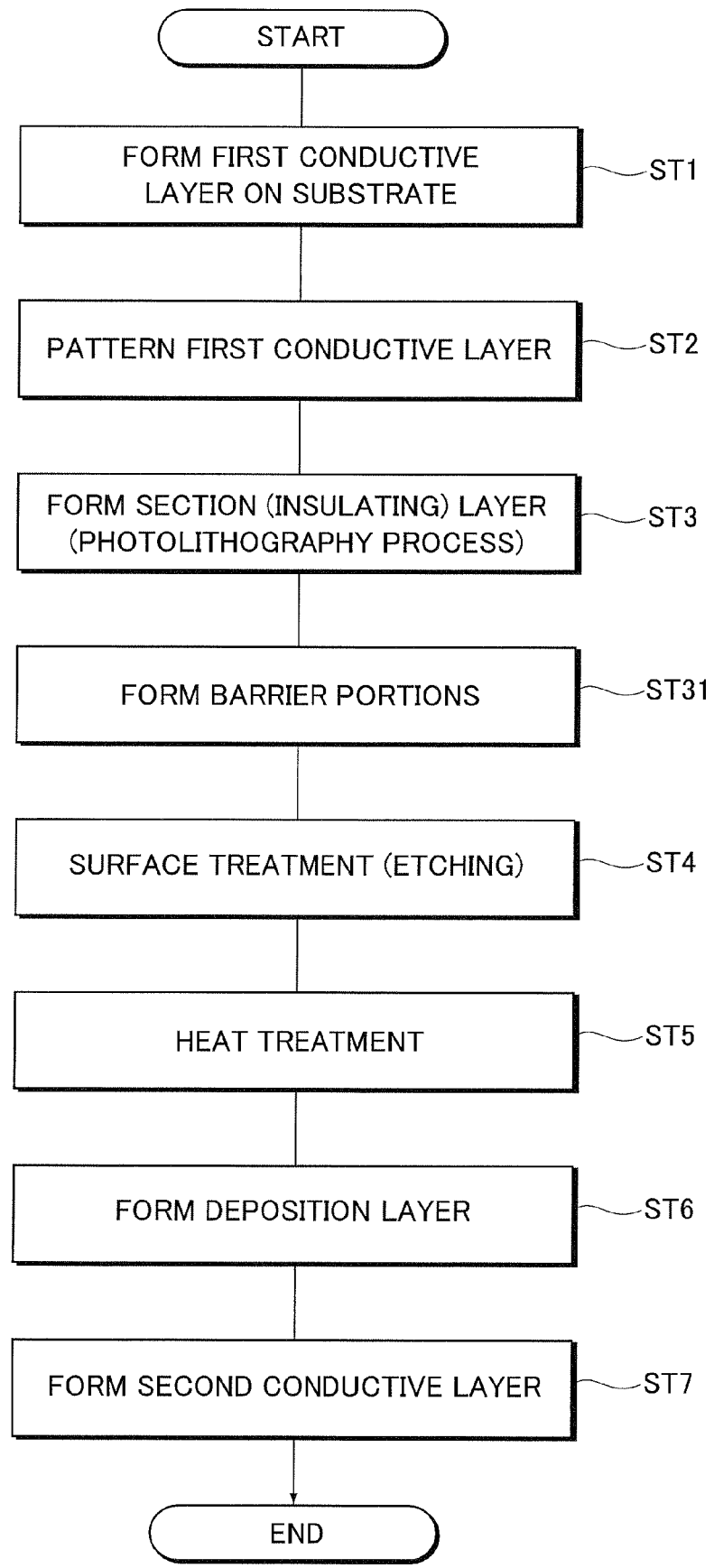
FIG. 7 is a flowchart for explaining the method of manufacturing the self-emission device unit according to the second embodiment of the present invention.

At step ST31, barrier portions 5 are formed on the sectioning layer 4 as shown in FIG. 6C. For example, the barrier portions 5 are formed by applying a photosensitive resin material or the like onto the sectioning layer 4, and developing it under a photomask. Here, the barrier portions 5 are formed in an inverted tapered shape, by utilizing a difference in the development rate ascribable to different amounts of exposure in the thickness direction during development. In the subsequent step ST4, generally the same surface treatment as in the first embodiment is applied. This forms thin portions 3f in the first conductive layer 3 as shown in FIG. 6D. At step ST5, heat treatment is applied if needed. In the subsequent steps ST6 and ST7, the deposition layer 6 and the second conductive layer 7 are formed on the surface-treated first conductive layer 3 as shown in FIGS. 6E and 6F. Here, the barrier portions 5 divide the deposition layer 6 and the second conductive layer 7, so that the deposition layer 6 and the second conductive layer 7 can be formed into a desired pattern without using a mask. The barrier portions 5 are not limited to the foregoing inverted tapered shape. For example, the process of ST31 may be performed twice to form barrier portions 5 of umbrella shape. Publicly-known methods may also be used.

As has been described, even when manufacturing the passive drive type self-emission panel according to the present embodiment, it is possible to apply surface treatment to the substrate after the formation of the barrier portions 5 on the sectioning layer 4 and before the formation of the deposition layer 6. This makes it possible to remove foreign substances adhering to the top of the first conductive layer 3 without damaging the sectioning layer 4 or the barrier portions 5, and prevent emission failures from occurring due to various factors.

Third Embodiment

In order to check the display characteristics of the self-emission panel according to the present invention, the inventor fabricated a self-emission panel according to the present invention and a self-emission panel without the application of the surface treatment according to the present invention, and made comparison as to display characteristics. Hereinafter, the method of manufacturing a self-emission panel according to the present embodiment will be described in more detail.

Initially, a layer of ITO (first conductive layer) is deposited to approximately 110 nm on a glass substrate 2 by using a sputtering-based fabrication method or the like. An ITO electrode of lattice pattern (first conductive layer 3) is formed by a photolithography-based fabrication method using a photoresist. Next, barrier portions 5 made of an insulating material are formed on the substrate 2 having the ITO electrode.

More specifically, in the process of forming the sectioning layer 4, a positive resist material having a relatively high electric insulating capability is applied onto the substrate 2 by spin coating, for example. The substrate 2 provided with the first conductive layer 3 and the sectioning layer 4 is heated to approximately 100° C. for about 80 seconds for solvent evaporation. In an exposure system, the resultant is exposed under a photomask with an irradiation condition of approximately 50 mJ/cm$^2$. Next, the resultant is developed in an aqueous alkali solution, and heated to 300° C. in a thermo-hygrostat bath to form the patterned sectioning layer 4.

Then, the support substrate 2 having the sectioning layer 4 is immersed into a bath of aqueous ferric chloride solution, or ITO etchant solution. After a lapse of a predetermined time, such as 50 seconds, the resultant is immersed into a bath of pure water to dilute the etchant solution on the support substrate 2. In the present embodiment, the support substrate 2 is immersed into another bath of pure water again, and vibrated in the bath to wash off the etchant solution. Then, the support substrate 2 is taken out of the bath, and dried by spin drying. The dried support substrate 2 is heated to approximately 300° C. on a hot plate under UV or ozone irradiation, for example.

After the heat treatment, the support substrate is put into a vacuum chamber, in which a hole injection layer, a hole transporting layer, a luminescent layer, and an electron injection layer are formed on the substrate by resistance heating evaporation. For example, the hole injection layer is made of copper phthalocyanine (CuPc) in a thickness of approximately 25 nm. The hole transporting layer is made of naphthyldiamine (α-NPD) in a thickness of approximately 45 nm. The luminescent layer is made of Alq3 (tris (8-hydroxyquinoline) aluminum) in a thickness of approximately 60 nm. The electron injection layer is made of lithium fluoride (LiF) in a thickness of approximately 0.5 nm.

Next, in the vacuum chamber, a top electrode (second conductive layer 7) of, e.g., aluminum is formed up to a thickness of approximately 100 nm by resistance heating evaporation at a rate of 1 nm/sec. By the manufacturing method described above, a self-emission device unit composed of organic EL devices is manufactured.

Next, the substrate 2 provided with the self-emission device unit is transferred to a chamber that is filled with nitrogen gas (N$_2$). A sealing glass plate coated with a UV-curing sealing adhesive and the substrate 2 having the self-emission device unit are fixed to each other, and the adhesive is cured by UV irradiation, thereby sealing the self-emission device unit. Drive circuits and the like are formed thereon to fabricate a self-emission panel.

After the first conductive layer 3 was dissolved in the ITO etchant solution in the foregoing process, the etched surfaces (recesses) of the first conductive layer 3 and the unetched surfaces thereof showed a level difference of approximately 50 angstroms. More specifically, a first distance from the surface of the substrate 2 to a first contact surface (the contact surfaces between the first conductive layer 3 and the sectioning layer 4) and a second distance from the surface of the substrate on the top-electrode side to a second contact surface (the contact surfaces between the first conductive layer 3 and the deposition layer 6) had a difference L33 of approximately 50 angstroms.

Next, a typical self-emission panel for comparison was fabricated by forming the deposition layer and the second deposition layer on the first layer without the application of the surface treatment to the substrate according to the present invention.

Description will now be given of the comparison between the display characteristics of the self-emission panel according to the present embodiment and the typical self-emission panel. The typical self-emission panel showed display failures such as smearing and unevenness inside the display panel. In contrast, the self-emission panel according to the present embodiment showed a favorable state of light emission, with no display failure such as smearing and unevenness observed.

Figure 8:
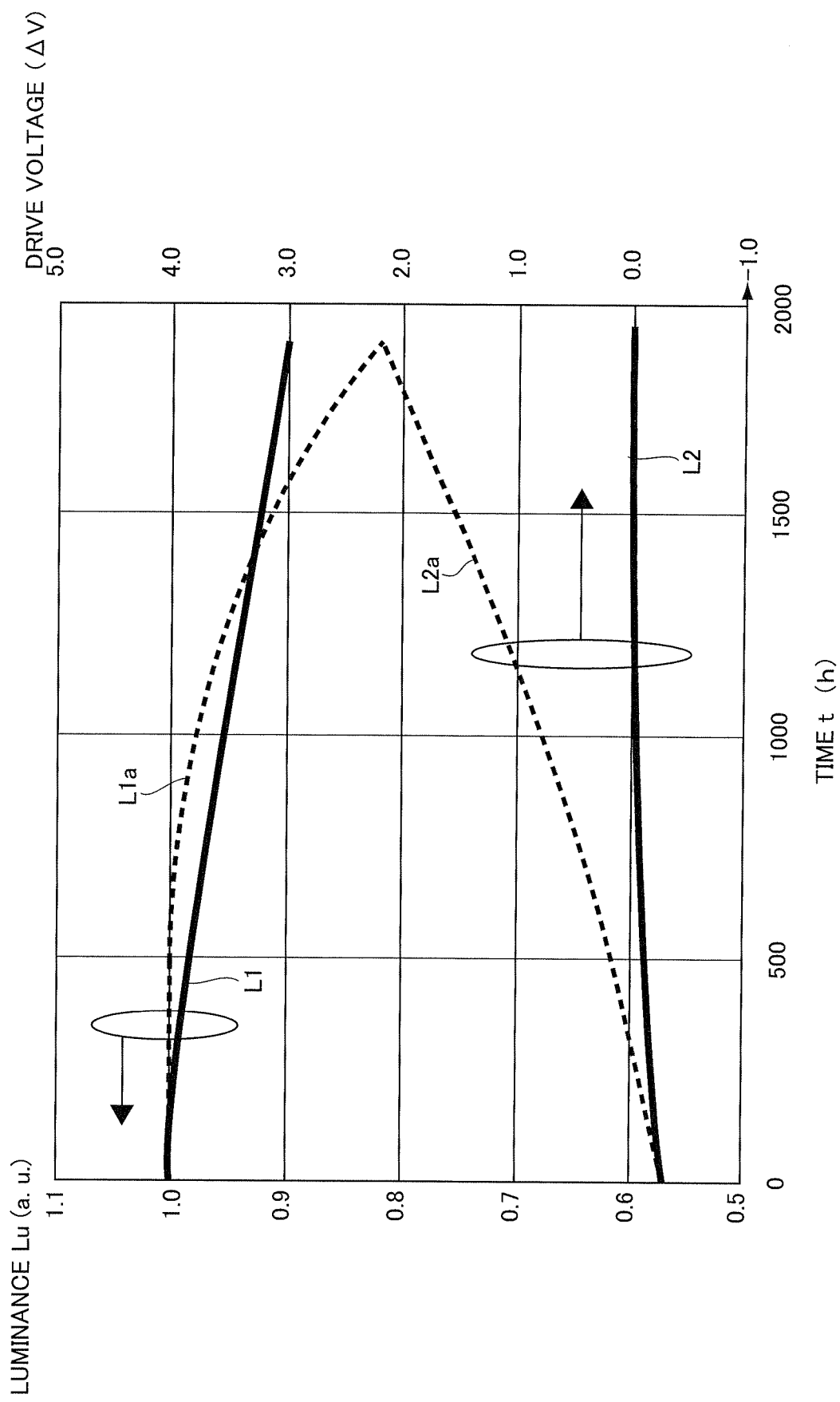
FIG. 8 is a chart for explaining the luminance characteristics and drive voltage characteristics of the self-emission panel according to a third embodiment of the present invention and a typical self-emission panel.

FIG. 8 is a chart for explaining the luminance characteristics and drive voltage characteristics of the self-emission panel according to the third embodiment of the present invention and the typical self-emission panel. The horizontal axis of FIG. 8 indicates time t. The upper full line L1 shows time variations in the luminance Lu of the self-emission panel according to the present embodiment. The upper broken line L1a shows time variations in the luminance Lu of the typical self-emission panel. The lower full line L2 shows time variations in the drive voltage of the self-emission panel according to the present embodiment (a voltage difference ΔV from a reference drive voltage). The lower broken line L2a shows time variations in the drive voltage of the typical self-emission panel (a voltage difference ΔV from the reference drive voltage).

As shown in FIG. 8, the typical self-emission panel dropped in luminance Lu sharply with time. On the other hand, the self-emission panel according to the embodiment of the present invention decreased in luminance Lu relatively slowly. Moreover, as shown in FIG. 8, the drive voltage ΔV of the typical self-emission panel increased generally in proportion to time after a lapse of a long period of time. In contrast, the self-emission panel according to the embodiment of the present invention showed an extremely low rate of increase in the drive voltage ΔV. As described above, it was confirmed that the self-emission panel according to the present invention has electric characteristics preferable to those of typical self-emission panels.

It should be appreciated that the present invention is not limited to each of the foregoing embodiments. The foregoing embodiments may be exercised in combination.

For example, the self-emission device unit 1 is not limited to the configuration shown in FIGS. 2A to 2A and 6. For example, the self-emission device may have an electron injection electrode on the bottom electrode (the first conductive layer 3), and a hole injection electrode on the top electrode (the second conductive layer 7). The self-emission device may also have a reflecting electrode as the bottom electrode, and a transparent electrode as the top electrode. Moreover, the self-emission device may have transparent electrodes both as the bottom electrode and as the top electrode.

Figure 9:
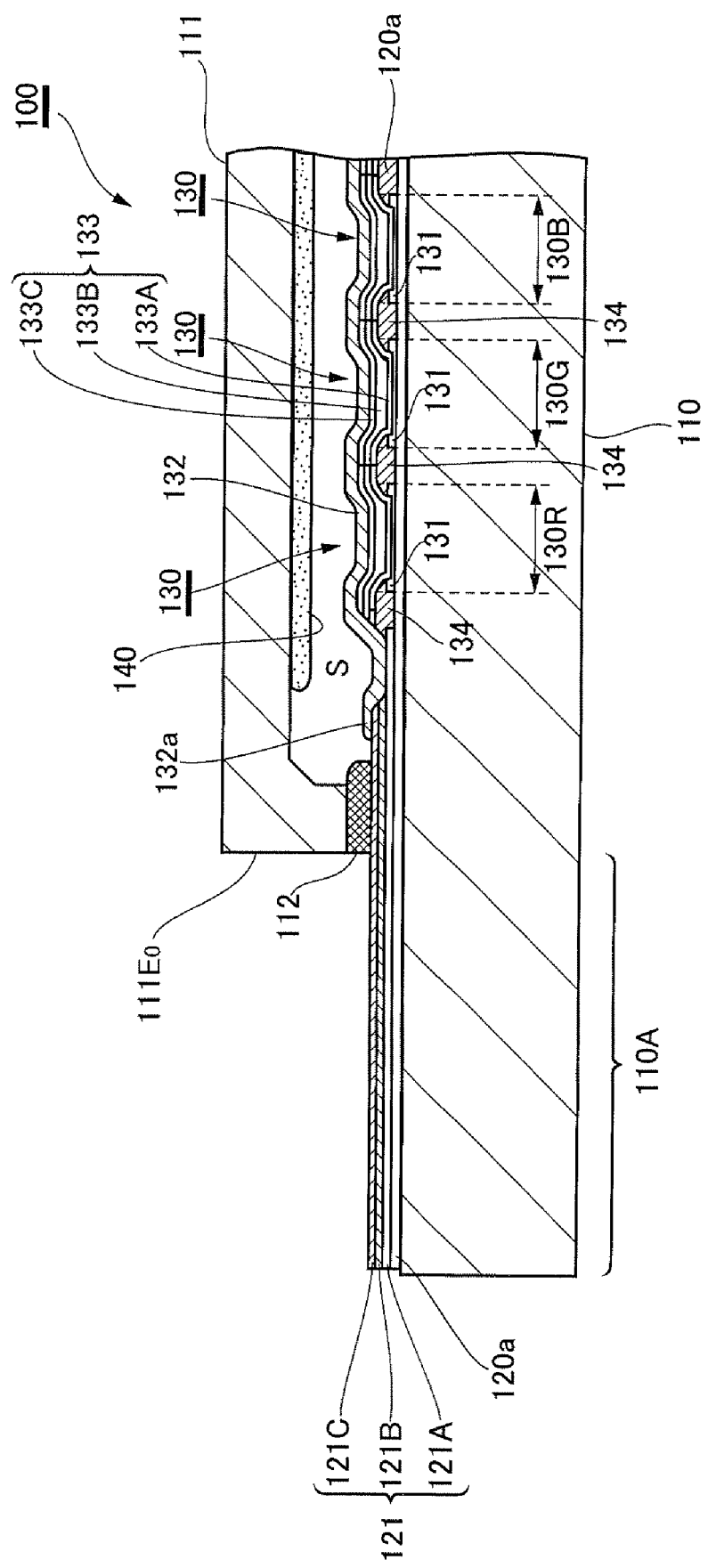
FIG. 9 is a sectional view for explaining a self-emission panel according to another embodiment of the present invention.

Hereinafter, the concrete configuration of the foregoing self-emission panel will be described with reference to FIG. 9, taking an organic EL panel for example.

An organic EL panel 100 has the basic configuration that a deposition layer 133 including a luminescent layer is interposed between first electrodes (bottom electrode) 131 and a second electrode (top electrode) 132 so that a plurality of organic EL devices 130 are formed on a support substrate 110. In the shown example, an $SiO_2$ coating layer 120a is formed on the support substrate 110. The first electrodes 131 formed thereon are transparent electrodes of ITO or the like, and are used as anodes (first conductive layer). The second electrode 132 (second conductive layer) is made of a metal material such as A1, and is used as a cathode. That is, this self-emission panel is of bottom emission type in which the light is emitted from the side of the support substrate 110. The deposition layer 133 has a three-layer structure including a hole transporting layer 133A, a luminescent layer 133B, and an electron transporting layer 133C, for example. The support substrate 110 and a sealing member 111 are pasted to each other via an adhesive layer 112, thereby forming a sealed area S. A self-emission device unit composed of the organic EL devices 130 is formed in this sealed area S.

In the shown example, the self-emission device unit composed of the organic EL devices 130 has an insulating layer 134 which sections the first electrodes 131. Unit display areas (130R, 130G, and 130B) made of the respective organic EL devices 130 are formed under the sectioned first electrodes 131. Drying means 140 is attached to the inner surface of the sealing member 111 which forms the sealed area S, so as to avoid degradation of the organic EL devices 130 due to humidity.

A first electrode layer 121A is formed over a lead area 110A at the end of the support substrate 110, by using the same material and the same process as those of the first electrodes 131. The first electrode layer 121A is patterned so that it is insulated from the first electrodes 131 via an insulating layer 134. A second electrode layer 121A for forming low-resistance wiring portions containing a silver alloy or the like is formed on the lead wiring area of the first electrode layer 121A. A protective coating 121C of IZO or the like is formed thereon if necessary. The first electrode layer 121A, the second electrode layer 121B, and the protective coating 121C constitute a lead wiring part 121. Then, an end 132a of the second electrode 132 is connected to the lead wiring part 121 at the inner end of the sealed area S.

The lead wiring of the first electrodes 131 is omitted from the diagram, whereas it can be formed by extending the first electrodes 131 out of the sealed area S. This lead wiring may also be made of an electrode layer having low-resistance wiring portions containing an Ag alloy or the like, as with the second electrode 132 described above.

An end rim 111E0 of the sealing member 111, facing toward the lead wiring part 121, is provided with holes that are made before the support substrate 110 and the sealing member 111 are pasted to each other.

Now, the details of the organic EL panel 100 will be described more specifically.

a. Electrodes:

Either the first electrodes 131 or the second electrode 132 is used as a cathode, and the other as anode. The anode is made of a material having a work function higher than that of the cathode. The anode is made of a metal material such as chromium (Cr), molybdenum (Mo), nickel (Ni), and platinum (Pt), or a transparent conductive material such as ITO and IZO. Conversely, the cathode is made of a material having a work function lower than that of the anode. The cathode may be made of such metals having low work functions as alkali metals (Li, Na, K, Rb, and Cs), alkali earth metals (Be, Mg, Ca, Sr, and Ba), and rare earth metals, or alloys made of combinations of these. When both the first electrodes 131 and the second electrode 132 are made of transparent materials, a reflecting film may be formed on the electrode side opposite from the light-emitting side.

The lead wiring parts (the lead wiring part 121 shown in the diagram and the lead wiring of the first electrodes 131) are connected with drive circuit components for driving the organic EL panel 100, or with a flexible wiring board. The lead wiring parts preferably have as low resistances as possible. As mentioned previously, they may be made of a lamination of low-resistance metal electrode layers such as Ag alloy, APC, Cr, and Al, or made of any one of these low-resistance metal electrodes alone.

b. Deposition Layer:

The deposition layer 133 is made of one or a plurality of layers of organic compound materials including at least one organic EL deposition layer. The layer configuration is not limited in particular. In general, as shown in FIG. 9, the hole transporting layer 133A, the luminescent layer 133B, and the electron transporting layer 133C may be laminated in this order from the anode side to the cathode side. Any of the luminescent layer 133B, the hole transporting layer 133A, and the electron transporting layer 133C may be laminated in plural, not a single layer alone. Either one or both of the hole transporting layer 133A and the electron transporting layer 133C may be omitted. Depending on the intended use, a hole injection layer, an electron injection layer, and the like may also be interposed. The hole transporting layer 133A, the luminescent layer 133B, and the electron transporting layer 133C may be made of materials selected as appropriate from those conventionally used (regardless of whether polymeric materials or low molecular weight materials).

The luminescent material for making the luminescent layer 133B may be either a fluorescent material or a phosphorescent material.

c. Sealing Member:

In the organic EL panel 100, the sealing member 111 for sealing the organic EL devices 130 air tightly may be a plate-like member made of glass, plastic, metal, or the like. Available sealing members include sealing substrates made of glass, having sealing recesses (regardless of whether single-grooved or double-grooved) formed by such processes as press molding, etching, and blasting. A flat glass plate may also be used to form the sealing area S with the support substrate 110, by using glass (or plastic) spacers. The foregoing sealing members may form the sealed area S by an airtight sealing method. Other sealing methods available include solid sealing methods such that the sealed area S is filled with a filler such as resin and silicone oil, and such that the sealed area S is sealed with a lamination film composed of a resin film and a metal foil having high barrier capability. A film sealing method of sealing the organic EL devices 130 with a barrier film or the like may also be used.

d. Adhesive:

The adhesive layer 112 may be made of adhesives of heat curing type, chemical curing type (two-component type), light (ultraviolet) curing type, etc. Such materials as acryl resins, epoxy resins, polyester, and polyolefin may be used. In particular, epoxy resin adhesives of ultraviolet curing type are preferably used since they cure quickly without any heat treatment.

e. Drying Means:

The drying means 140 may be any of the following: physical drying agents such as zeolite, silica gel, carbon, and carbon nanotubes; chemical drying agents such as alkali metal oxides, metal halides, and chlorine dioxide; drying agents formed by dissolving organometal complexes in petroleum solvents such as toluene, xylene, and aliphatic organic solvents; and drying agents formed by dispersing drying agent particles in transparent binders such as polyethylene, polyisopropylene, and polyvinyl cinnamate.

f. Types of Organic EL Panel:

The organic EL panel 100, an embodiment of the present invention, is subject to various types of modifications in design without departing from the gist of the present invention. For example, the means for emitting light occurring from the organic EL devices 130 may be of bottom emission system in which the light is emitted from the side of the support substrate 110 as described above, or of top emission system in which the light is emitted from the side of the sealing member 111 (in this case, the sealing member 111 needs to be made of a transparent material. The arrangement of the drying means 140 must also be taken into account). Multiphoton structures may also be employed. Moreover, the organic EL panel 100 may be either a monochromatic display or a multicolor display. Aside from a colored pixel system, the multicolor display may also be achieved by any of the following systems: ones in which a white, blue, or other monochromatic deposition layer is combined with color filters or color conversion layers of fluorescent materials (CF system, CCM system); one in which emission areas of a monochromatic deposition layer are irradiated or otherwise processed with electromagnetic waves so as to achieve a plurality of types of light emission (photobleaching system); one in which two or more color unit display areas are stacked into a single unit display area (transparent Stacked OLED system or SOLED system); and a laser transfer system in which low-molecular organic materials for emitting different colors of light are deposited on different films in advance, and transferred onto a single substrate by laser heat transfer. While the example shown in the diagram has dealt with the passive drive system, an active drive system may be employed in which a TFT substrate is used as the support substrate 110, and the first electrodes 131 are formed thereon.

Figure 10:
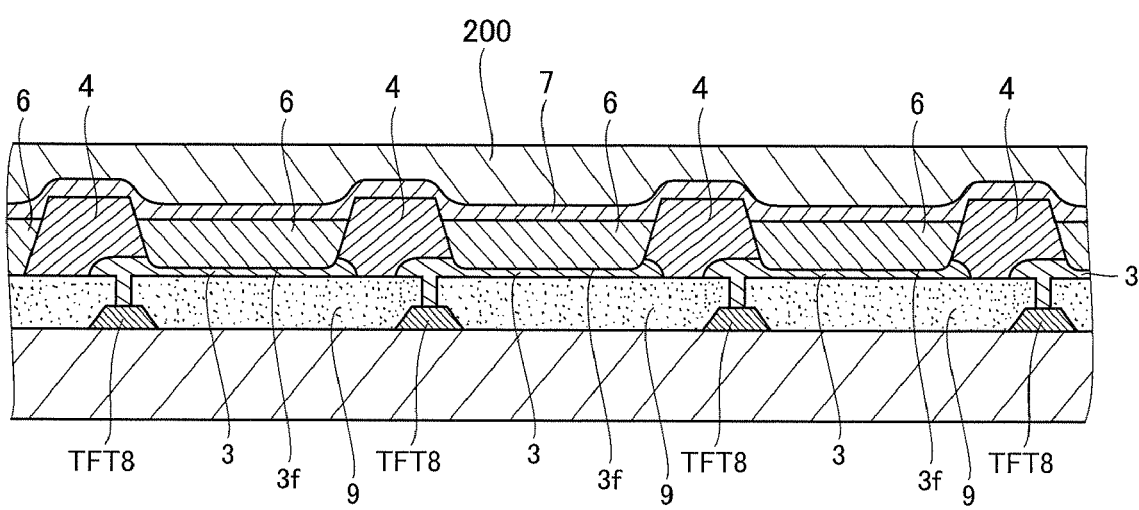
FIG. 10 is a sectional view for explaining a self-emission panel according to the other embodiment of the present invention.

FIG. 10 is a diagram for explaining a self-emission panel according to another embodiment of the present invention. An active drive type self-emission panel according to the present invention will be described with reference to FIG. 10. Description common to the foregoing embodiments will be omitted in part. As shown in FIG. 10, the active drive type self-emission panel according to the present embodiment has a TFT substrate, or a substrate 2 on which TFTs (Thin Film Transistors) 8 are formed as driving transistors. A flattening film 9 is formed on the TFT substrate, and a first conductive layer 3 is formed on the flattening film 9. A sectioning layer 4, a deposition layer 6, a second conductive layer 7, a protective layer 200, and the like are formed thereon. Even with the active drive type self-emission panel of the foregoing configuration, the surface treatment according to the present invention can be applied to the first conductive layer 3, thereby preventing emission failures from occurring due to various factors. It is therefore possible to obtain a self-emission panel that is free from emission failures.

As has been described, the self-emission panel has self-emission devices formed in the openings for making the emission areas. The self-emission devices are fabricated by forming the first conductive layer 3 on the substrate 2 directly or via other layers, laminating the deposition layer including the luminescent layer on the first conductive layer 3, and forming the second conductive layer 7 on the deposition layer 6. This process includes: the first step of forming the sectioning layer 4 for sectioning the openings 3b for making the emission areas A1 on the first conductive layer 3a after the formation of the first conductive layer 3a; the second step of applying surface treatment to at least the surface of the first conductive layer inside the openings; and the third step of depositing the deposition layer 6 at least on the first conductive layer 3d that is given the surface treatment in the second step. Since the surface treatment can be effectively applied to the first conductive layer, it is possible to prevent emission failures from occurring because of a short circuit and the like due to various factors.

To be more specific, the application of the surface treatment according to the present invention to the first conductive layer 3 can resolve deposition failures. Moreover, the application of the surface treatment according to the present invention removes foreign substances such as coatings and dust particles from between the first conductive layer and the deposition layer. This allows a reduction of electron (hole) injection troubles. Even if such structures as the sectioning layer 4 and the barrier portions 5 are formed, it is possible to apply the surface treatment to the surface of the first conductive layer 3 inside the openings without damaging the sectioning layer 4, the barrier portions 5, and other structures. Since the deposition layer 6 is deposited after the application of the surface treatment to the first conductive layer 3, it is possible to form the favorable deposition layer as described above. Moreover, the self-emission devices formed by the foregoing manufacturing method can be incorporated to obtain a self-emission panel that has favorable emission characteristics, for example, free from smearing, unevenness, or other display failures.

The self-emission device panel according to the present invention comprises: the first conductive layer 3 formed on the substrate 2 directly or via other layers; the deposition layer 6 laminated on the first conductive layer 3, including the luminescent layer; the second conductive layer 7 formed on the deposition layer 6; and the sectioning layer 4 for sectioning the openings 3b for making the emission areas A1 on the first conductive layer 3. The first conductive layer 3 has the thin portions 3f which are formed in the openings 3b by surface treatment, and the surfaces of the thin portions 3f make the contact surfaces with the deposition layer 6. This configuration makes it possible to prevent emission failures from occurring.

That is, the sectioning layer 4 is formed by patterning the insulating layer that is formed on the first conductive layer 3 and the base surface 2a, so that it covers at lest the edges 3c of the first conductive layer 3. The first conductive layer 3 has a difference in level between the surfaces 3e in the openings 3b and the surfaces 3g covered with the sectioning layer 4. The deposition layer 6 can thus be formed on the thin portions 3f with no foreign substance, which precludes the occurrence of emission failures. In other words, since the surfaces 3e of the thin portions 3f are processed by chemical surface treatment or physical surface treatment, it is possible to form the deposition layer 6 on the thin portions 3f without the intervention of foreign substances, thereby obtaining favorable emission characteristics.

The provision of the thin portions 3f in the first conductive layer 3 can also improve the light emission efficiency.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A method of manufacturing a self-emission panel, including forming a first conductive layer on a substrate directly or via another layer, laminating a deposition layer including a luminescent layer on said first conductive layer, and forming a self-emission device in an opening for making an emission area, the self-emission device constituting a second conductive layer on said deposition layer, the method comprising:

a first step of forming a sectioning layer for sectioning the opening for making an emission area on said first conductive layer after the formation of said first conductive layer, said sectioning layer covering a portion of the first conductive layer, and said first conductive layer having a thin portion in said opening, a surface of which makes a contact surface with said deposition layer; wherein said first conductive layer has a difference in surface level between inside said opening and substantially all of the portion covered with said sectioning layer; and wherein the thin portion has a flat smooth surface and a thickness smaller than a thickness of portions of the first conductive layer covered with the sectioning layer;

a second step of applying surface treatment to at least a surface of said first conductive layer inside said opening after said first step; and a third step of depositing said deposition layer at least on said first conductive layer that is given said surface treatment;

wherein said surface treatment is effected by etching said first conductive layer selectively with respect to said sectioning layer.

2. The method of manufacturing a self-emission panel according to claim 1, wherein said sectioning layer is formed so as to cover at least an edge of said first conductive layer.

3. The method of manufacturing a self-emission panel according to claim 1, wherein said first conductive layer has a thin portion in said opening, a surface of which makes a contact surface with said deposition layer, wherein said first conductive layer has a difference in surface level between said thin portion and other portions covered with said sectioning layer.

4. The method of manufacturing a self-emission panel according to claim 1, wherein said first conductive layer has a thin portion, in said opening, a surface of which makes a contact surface with said deposition layer, wherein said first conductive layer has a difference in surface level between said thin portion and other portions covered with said sectioning layer, wherein said thin portion has a thickness smaller than the thickness of other portions covered with said sectioning layer, and said thin portion has a flat smooth surface.

* * * * *